United States Patent [19]

Abe et al.

[11] Patent Number: 5,518,776

[45] Date of Patent: May 21, 1996

[54] PRODUCTION OF STRONTIUM TITANATE THIN FILMS

[75] Inventors: Yoshio Abe, Kyoto; Yukio Hamaji, Nagaokakyo; Yukio Sakabe, Kyoto, all of Japan

[73] Assignee: Murata Manufacturing Co., Ltd., Japan

[21] Appl. No.: 197,008

[22] Filed: Feb. 15, 1994

Related U.S. Application Data

[63] Continuation of Ser. No. 980,306, Nov. 23, 1992, abandoned.

[30] Foreign Application Priority Data

Nov. 21, 1991 [JP] Japan ................................. 3-334105

[51] Int. Cl.$^6$ .......................................................... B05D 1/18
[52] U.S. Cl. .................................. 427/430.1; 427/126.1; 427/126.2; 427/126.3
[58] Field of Search .......................... 427/430.1, 126.1, 427/126.2, 126.3

[56] References Cited

U.S. PATENT DOCUMENTS

| | | | |
|---|---|---|---|
| 4,485,094 | 11/1984 | Pebler et al. | 427/87 |
| 4,946,710 | 8/1990 | Miller et al. | 427/126.3 |
| 5,160,762 | 11/1992 | Brand et al. | 427/79 |

FOREIGN PATENT DOCUMENTS 0459575  5/1991  European Pat. Off. .

OTHER PUBLICATIONS

The Condensed Chemical Dictionary, 10th ed., pp. 958, 1981 (no month).

Selvaraj et al., "Sol–gel thin films of strontium titanate (SrTiO$_3$) from chemically modified alkoxide precursors", Materials Letters, 12(5) 311–15, 1991 (no month).

Chen et al., "Barium and strontium titanate films from hydroxide–alkoxide precursors", J. Mat. Sci. Let. 10 (1991) 1000–1002.

Takahashi et al., "Dip–coating of TiO$_2$ films using a sol derived from Ti(O–i–Pr)$_4$–diethanolamine–H$_2$O–i–PrOH system." J. Mat. Sci. 23 (1988) 2259–2266 (no month).

*Primary Examiner*—Shrive Beck
*Assistant Examiner*—David M. Maiorana
*Attorney, Agent, or Firm*—Ostrolenk, Faber, Gerb & Soffen

[57] ABSTRACT

A thin film of strontium titanate is formed on a substrate by immersing a substrate in an aqueous solution containing strontium ions and titanium alkoxide. The aqueous solution may contain not more than 20 vol % of one or more alkanolamines expressed by the general formula:

$$HO(C_nH_{2n})_mNH_{3-m}$$

with n=not more than 10, and m=1, 2 or 3.

6 Claims, No Drawings

PRODUCTION OF STRONTIUM TITANATE THIN FILMS

This is a Continuation of application Ser. No. 07/980,306, filed on Nov. 23, 1992 now abandoned.

BACKGROUND OF THE INVENTION

1. Field of the Invention

The present invention relates to a method for production of thin films and, more particularly, a method for producing thin films of strontium titanate on desired substrates without use of complex procedures.

2. Description of the Prior Art

In general, strontium titanate, $SrTiO_3$, has been utilized as a dielectric material for various electronic devices such as, for example, capacitors because of its superior properties. For such applications, strontium titanate is preferably used in the form of thin films to make the best use of its properties.

As a method for formation of thin films of strontium titanate on substrates, there have been so far known various methods such as, for example, a sputtering process (Nikkei microdevices, 1991, June, pp. 78–86), a plasma deposition process (JP-A-1-175714), and a hydrothermal, electrochemical method (JAPANESE JOURNAL OF APPLIED PHYSICS, Vol. 30, No. 1B (1990), pp. L123).

However, the processes of the above prior art for formation of thin films of strontium titanate have various problems awaiting a solution. For example, the first two, i.e., the sputtering process and plasma deposition process, have the following problems: (a) They requires use of expensive complex equipment, resulting in considerable increase of plant investment; (b) it is difficult with such a process to deposit thin films on substrates with a complex configuration other than a plate form; and (c) the material for substrates is limited only to those which can stand high temperatures as the substrate is subjected to high temperatures. The last one, i.e., hydrothermal electrochemical method, includes such problems that it is required to use a substrate made of metallic titanium or coated with metallic titanium, that it requires complex steps, and that the substrate is considerably limited in material as the formation of thin films is carried out under conditions of high temperature and pressure.

Recently, an interesting work related to production of a dielectric ceramic material has been reported in "Journal of Materials Science" 25 (1990), 1169–1183. This report teaches that barium titanate can be produced in the form of powder hydrolyzing titanium alkoxide in a solution containing barium ions at low temperatures. However, it suggests nothing about possibility of production of thin films of dielectric materials.

SUMMARY OF THE INVENTION

It is an object of the present invention to provide a method for production of thin films of strontium titanate which overcomes the aforesaid disadvantages of the prior art.

Another object of the present invention is to provide a method for production of thin films of strontium titanate which makes it possible to form thin films on any desired substrates of, for example, inorganic materials, metallic materials, organic materials and composite materials thereof.

The above and other objects of the present invention are achieved by hydrolyzing titanium alkoxide in an aqueous solution containing strontium ions, while controlling the rate of hydrolysis of titanium alkoxide to slowly proceed the reaction of strontium ions with titanium ions, thereby depositing strontium titanate on a substrate immersed in the aqueous solution.

According to the present invention, there is provided a method for producing thin films of strontium titanate on a substrate, said method comprising the step of immersing a substrate in an aqueous solution containing strontium ions and one or more titanium alkoxides or derivatives thereof.

Preferably, the aqueous solution is so controlled that concentrations of strontium ions and titanium alkoxide, when respectively converted into molar concentrations of $Sr^{2+}$ ions and $Ti^{4+}$ ions, fall within the following respective ranges: $0.01 \text{ mM/l} \leq Sr^{2+} \leq 50 \text{ mM/l}$, $0.01 \text{ mM/l} \leq Ti^{4+} \leq 100 \text{ mM/l}$.

Preferably, the aqueous solution is added with not more than 20 vol % of one or more alkanolamines expressed by the general formula: $HO(C_nH_{2n})_mNH_{3-m}$ with n=not more than 10 and m=1, 2 or 3, to control the rate of hydrolysis of titanium hydroxide constant. The alkanolamines includes, without being limited to, ethanolamines, propanolamines, butanolamines, etc.

As a source of strontium ions, there may be used water-soluble inorganic salts of strontium such as strontium nitrate, strontium chloride, strontium sulphate and the like.

As a titanium alkoxide, there may be used those such as titanium butoxide, titanium ethoxide, titanium propoxide and derivatives of titanium alkoxides. The most preferred results are obtained by use of titanium alkoxide modified by one or more alkanolamines expressed by the general formula: $HO(C_nH_{2n})_mNH_{3-m}$ with n=not more than 10 and m=1, 2 or 3.

During formation of thin films of strontium titanate, the aqueous solution is preferably maintained to a temperature within the range of 50° to 110 °C. Further, the pH of the aqueous solution is preferably maintained to a value of not less than 13.

Under the suitable reaction conditions including the rate of hydrolysis of titanium alkoxide, ion concentrations of the aqueous solution, reaction temperature, and pH of the solution, heterogeneous nucleation of strontium titanate takes place on solid surfaces, i.e., the substrate surface and a surface of the vessel containing the aqueous solution, and the growth of nuclei produces thin films on the substrate. In this case, it is possible to prevent the aqueous solution from homogeneous nucleation which results in formation of a precipitate or powder of strontium titanate.

According to the present invention, it is therefore possible to produce thin films of strontium titanate on surfaces of any desired substrate only by immersing the substrate in the aqueous solution with controlled composition. Thus, the operation of film formation can be considerably simplified.

The present invention will become apparent from the following description in connection with preferred examples.

EXAMPLE

Using guaranteed reagents of strontium nitrate, ethanolamine-modified titanium butoxide (hereinafter referred to as "TBEA") and potassium hydroxide, there were prepared aqueous solutions by dissolving them in ion-exchanged water so as to have ion concentrations of strontium ions and TBEA and pH value shown in Table 1. The value pH of each solution was adjusted by adding potassium hydroxide. In Table 1, the concentrations of strontium ions and TBEA are converted into molar concentrations of $Sr^{++}$ and $Ti^{4+}$ ions, and specimens No. 1 and 2 with an asterisk (*) are those outside of the scope of the present invention.

The above aqueous solution was added with 5 vol % of triethanolamine to keep the rate of hydrolysis of TBEA constant. Then, 100 ml of the resultant aqueous solution was placed into a vessel of polystyrene and three kinds of substrates with size of 10×15×2 mm, each being composed of sintered alumina, slide glass or platinum, were respectively immersed therein. The solution was heated to and maintained at a temperature shown in Table 1 for 20 hours to proceed the reaction of strontium ion with titanium ions.

TABLE 1

| No. | $Sr^{2+}$ (mM/l) | TBEA (mM/l) | pH | Temp. (°C.) |
|---|---|---|---|---|
| 1* | 0.005 | 100 | 12.5 | 110 |
| 2* | 100 | 0.005 | 13.5 | 110 |
| 3 | 0.01 | 0.01 | 14.5 | 110 |
| 4 | 0.1 | 0.1 | 14.5 | 100 |
| 5 | 1 | 1 | 14.5 | 90 |
| 6 | 10 | 10 | 14.1 | 70 |
| 7 | 50 | 50 | 13.5 | 55 |
| 8 | 50 | 1 | 13.5 | 60 |
| 9 | 50 | 0.01 | 14.5 | 80 |
| 10 | 0.01 | 100 | 14.5 | 80 |

After being taken out of the solution, the substrate was observed as to the existence and quality of thin films of strontium titanate deposited thereon.

For the specimens No. 3 to 10 each employing the aqueous solution falling within the scope of the present invention, it was observed that uniform thin films of strontium titanate are deposited on the three kinds of substrates.

In contrast therewith, uniform thin films were never observed on specimens No. 1 and 2 immersed in the aqueous solution containing 0.005 mM/l of $Sr^{++}$ ions (specimen No. 1) or 0.005 mM/l of TBEA (specimen No. 2).

Although no data are shown in Table 1, the solution with the $Sr^{2+}$ ion concentration exceeding 50 mM/l, for example, 200 mM/l did not provide thin films of strontium titanate and resulted in formation of powdered strontium titanate (precipitate). Also, the aqueous solution with the concentration of TBEA exceeding 100 mM/l, for example, 300 mM/l, did not provide thin films of strontium titanate and resulted in formation of powdered strontium titanate (precipitate). This results from the fact that uniform nucleation of strontium titanate takes place in the aqueous solution.

For these reasons, it is preferred to use aqueous solutions containing 0.01 to 50 mM/l of $Sr^{2+}$ ions and 0.01 to 100 mM/l, in term of $Ti^{4+}$ ions, of titanium alkoxide.

Further, if the temperature of the aqueous solution is less than 50° C., crystalline thin films of strontium titanate are never obtained. If the temperature of the aqueous solution exceeds 110° C., the substrate surface is cut off from the solution by bubbles attached thereto, resulting in considerable decrease of the continuity and uniformity of thin films.

Thus, it is preferred to control the temperature of the aqueous solution to 50° to 110° C. during the formation of thin films of strontium titanate.

Further, if the pH value of the aqueous solution is less than 13, undesired phases other than strontium titanate are produced during film formation. For this reason, the pH value of the aqueous solution is preferably adjusted to 13 or above.

In the above example, the sintered alumina plates, slide glass plates and platinum plates are used as substrates for thin films of strontium titanate films. However, any other materials may be used as a substrate for thin films of strontium titanate. Further, the substrates may take any configurations such as, for example, spheres, fibers, sponge-like members, without being limited to plates, films, foils and the like.

As will be understood from the above, according to the present invention, strontium titanate thin films can be produced by only immersing the substrate in the aqueous solution, thus making it possible to produce uniform thin films of strontium titanate on any desired substrate regardless of its complex configuration. In addition, it is possible with the present invention to produce dense, uniform dielectric thin films of strontium titanate easily and economically.

Further, since the thin films of strontium titanate can be directly formed on the substrates regardless of configuration, shape or kind of the substrates, it is possible to select a material and configuration of substrates from wide ranges, which in turn makes it possible to expand the area of application of strontium titanate thin films.

Although the present invention has been fully described in connection with the preferred examples, it is to be noted that various changes and modifications, which are apparent to those skilled in the art, are to be understood as included within the scope of the present invention as defined by the appended claims unless they depart therefrom.

What is claimed is:

1. A method for producing thin films of strontium titanate on a substrate, said method comprising the step of immersing a substrate in an aqueous solution containing strontium ions and one or more titanium alkoxides or derivatives thereof, wherein said aqueous solution is maintained at a temperature within the range of 50° to 110° C. and said aqueous solution has a pH value of not less than 13 and separating the resulting strontium titanate coated substrate from the aqueous solution.

2. The method according to claim 1 wherein said aqueous solution contains not more than 20 vol % of one or more alkanolamines expressed by the general formula:

$$HO(C_nH_{2n})_mNH_{3m}$$

with n=not more than 10 and m=1, 2 or 3.

3. The method according to claim 1 wherein said aqueous solution contains strontium ions and titanium alkoxides so that their concentrations, when respectively converted into molar concentrations of $Sr^{2+}$ ions and $Ti^{4+}$ ions, fall within the following respective ranges:

$$0.01 \text{ mM/l} \leq Sr^{2+} \leq 50 \text{ mM/l}$$

$$0.01 \text{ mM/l} \leq Ti^{4+} \leq 100 \text{ mM/l}.$$

4. The method according to claim 1 wherein said titanium alkoxide is an alkoxide modified by an alkanolamine expressed by the general formula:

$$HO(C_nH_{2n})_mNH_{3-m}$$

with n=not more than 10, and m=1, 2 or 3.

5. The method according to claim 4 wherein said aqueous solution contains not more than 20 vol % of one or more alkanolamines expressed by the general formula:

$$HO(C_nH_{2n})_mNH_{3-m}$$

with n=not more than 10 and m=1, 2 or 3.

6. The method according to claim 5 wherein said aqueous solution contains strontium ions and titanium alkoxides so that their concentrations, when respectively converted into molar concentrations of $Sr^{2+}$ ions and $Ti^{4+}$ ions, fall within the following respective ranges:

$$0.01 \text{ mM/l} \leq Sr^{2+} \leq 50 \text{ mM/l}$$

$$0.01 \text{ mM/l} \leq Ti^{4+} \leq 100 \text{ mM/l}.$$

* * * * *